(12) United States Patent
Doyle et al.

(10) Patent No.: US 8,515,358 B2
(45) Date of Patent: Aug. 20, 2013

(54) TESTING OF AUTOMOBILE MOUNTED ANTENNAS

(75) Inventors: Matthew Doyle, Donaustauf (DE); Jose Rodrigo Camacho-Perez, Zapopan (MX)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 13/453,130

(22) Filed: Apr. 23, 2012

(65) Prior Publication Data

US 2012/0206305 A1 Aug. 16, 2012

Related U.S. Application Data

(62) Division of application No. 12/327,090, filed on Dec. 3, 2008, now Pat. No. 8,185,059.

(60) Provisional application No. 61/005,187, filed on Dec. 3, 2007.

(51) Int. Cl.
*H04B 17/00* (2006.01)

(52) U.S. Cl.
USPC .................................................. 455/67.14

(58) Field of Classification Search
USPC ...................................................... 455/67.14
See application file for complete search history.

(56) References Cited

U.S. PATENT DOCUMENTS

| | | | | |
|---|---|---|---|---|
| 6,006,147 A | * | 12/1999 | Hall et al. | 701/33.2 |
| 2003/0142003 A1 | * | 7/2003 | Horst et al. | 342/42 |

* cited by examiner

*Primary Examiner* — Daniel Rojas

(57) ABSTRACT

A method and device provides for the testing and validation of a control module for receiving wireless data and communications utilizes a transmission line coupler mounted proximate the control module generates a signal that couples to an antenna of the control module. The control module produces a signal in response to coupling of the antenna with the signal produced by the transmission line coupler. The resulting signal is utilized to check, verify and validate operation of the control module.

11 Claims, 2 Drawing Sheets

TESTING OF AUTOMOBILE MOUNTED ANTENNAS

CROSS REFERENCE TO RELATED APPLICATION

This application is a division of U.S. application Ser. No. 12/327,090 entitled Testing of Automobile Mounted Antennas, filed on Dec. 3, 2008, which claims the benefit of U.S. Provisional Application No. 61/005,187, filed Dec. 3, 2007. This application claims the benefit of U.S. Provisional Application No. 61/005,187, filed Dec. 3, 2007. The entire contents of U.S. application Ser. No. 12/327,090 and U.S. Provisional Application No. 61/005,187 are incorporated herein by reference.

BACKGROUND OF THE INVENTION

This disclosure generally relates to an antenna testing method. More particularly, this disclosure relates to a method of testing antennas mounted within a motor vehicle.

Motor vehicles are increasingly relying on wireless communication for the transfer of vehicle operating data. Accordingly, motor vehicles include additional antennas mounted in various locations to facilitate the desired wireless transfer of data. Each antenna is tested and validated to assure proper operation. Each antenna must be able to receive data reliably at a minimum power level. The sensitivity of each antenna is therefore tested to verify its capability of receiving data the desired power level.

Typical test methods include the injection of a signal at an input to a module including the antenna. However, such tests only verify the capability of the module and the corresponding links back the vehicle control module or other device. Such tests bypass the antenna and therefore do not accurately reflect actual operation of a system, module and antenna. Other methods include the use of directional antenna to direct electromagnetic energy onto the control module. Such methods disrupt the surrounding environment in which the control module operates and therefore do not provide the desired replication of actual operating conditions.

Accordingly, it is desirable to design and develop testing methods and devices that more accurately verify actual operating capabilities.

SUMMARY OF THE INVENTION

A disclosed method and device provides for the testing and validation of a control module for receiving wireless data and communications. A transmission line coupler mounted proximate the control module generates a signal that couples to an antenna of the control module. The control module produces a signal in response to coupling of the antenna with the signal produced by the transmission line coupler. The resulting signal is utilized to check, verify and validate operation of the control module.

Accordingly, the example method and device provides for the testing and validation of a control module having an internal antenna in substantially the same operational environment as the control module will encounter during operation. Further, the example testing and validation method does not require specialized directional equipment.

These and other features of the present invention can be best understood from the following specification and drawings, the following of which is a brief description.

DETAILED DESCRIPTION OF THE PREFERRED EMBODIMENT

Figure 1:
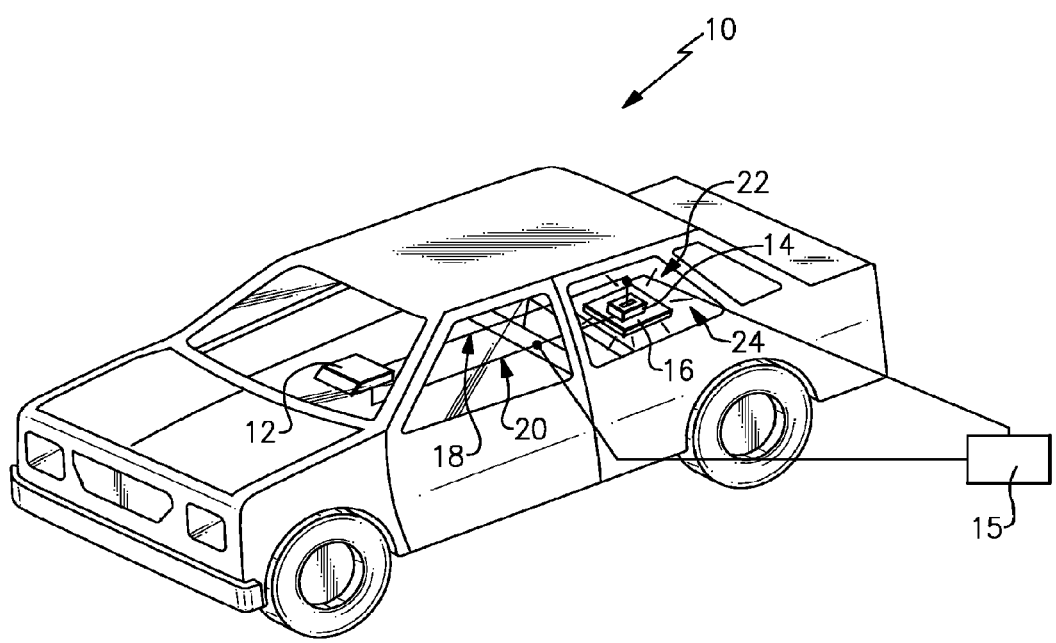
FIG. 1 is a schematic view of a vehicle including an example control module including a test device.

Referring to FIG. 1, a vehicle 10 includes an electronic control unit 12 that receives data from a control module 14. The example control module 14 includes a receiver for receiving wireless transmissions such as for a remote keyless entry system, a tire pressure monitoring system, and/or any other system that utilizes the wireless communication of data or other information. As appreciated, the location of the control module 14 can be anywhere within the motor vehicle 10. Further, although one control module 14 is illustrated, many control modules could be located throughout the vehicle 10 to receive transmissions from different systems.

Performance of the example control module 14 is tested by coupling a test signal from a test device 16 with an antenna of the control module 14. The test device 16 is mounted proximate the control module 14 in a manner that does not alter the environment in which the control module 14 will operate. The example test device 16 is mounted between a portion of the vehicle body 24 and the control module 14, such that the test device 16 does not itself alter the surrounding and impact reception of the generated wireless signal. The example test device 16 receives a test signal 20 from the electronic control unit 12 that results in the emission of a wireless signal 22. The wireless signal 22 couples with the antenna of the control module 14, which in turn sends a signal 18 back to the control unit 12. The return signal 18 is compared to the test signal 20 to determine if the control module 14 is operating as desired.

Although the described example utilizes the control unit 12 to produce the desired wireless signal 22, other external or internal modules could be connected to the test device 16 to generate the desired wireless signal 22. Further, the test device 16 could include connections to an external controller 15 to provide for the testing and validation of the control module 14.

Figure 2:
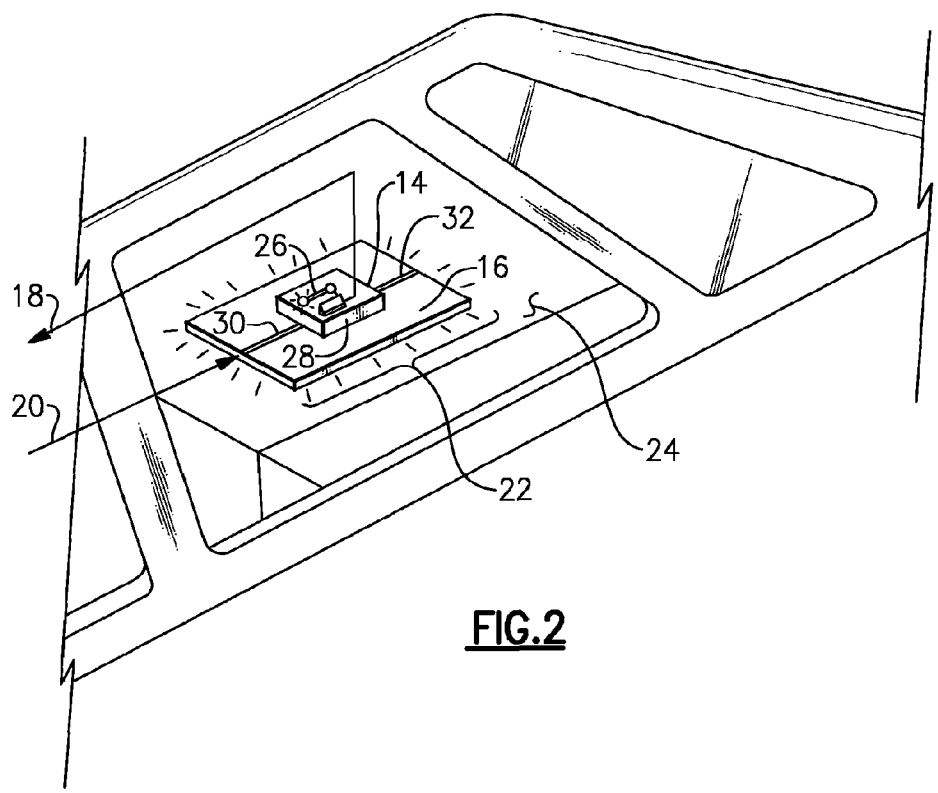
FIG. 2 is an enlarged view of the example control module and test device.

Referring to FIG. 2, the example test device 16 comprises a transmission line coupler. A transmission line coupler is a device that passes energy from a transmission line into a separate line. In this example, an internal antenna 26 of the control module 14 is coupled to the transmission line coupler 16. The input signal 20 to the transmission line coupler 16 generates the signal 22 that couples with the antennal 26. The energy received or transferred from the test transmission line coupler 16 to the antenna 26 produces an output signal 18 that is utilized to evaluate and validate operation of the control module 14.

The example input signal 20 is of a desired frequency and amplitude to generate electromagnetic energy that is received by the antenna 26. Accordingly, in operation, the test signal 20 is injected at an input 30 of the transmission line coupler 16. The example transmission line coupler 16 then produces the wireless signal 22 comprising electromagnetic energy. Electromagnetic energy couples with the antenna 26 disposed as part of the control module 14. The coupled antenna 26 then produces a signal indicative of receiving the test signal, and that return signal 18 is sent back to the control unit 12. Because the antenna 26 is coupled to the transmission line coupler 16 through the electromagnetic signal 22, the return signal 18 can be substantially continuous to provide significant return signals for evaluation.

The control unit 12 performs an evaluation of the return signal 18. The evaluation of the return signal 18 can include the measurement of received signal strength or a measurement of specific signal characteristics such as frequency. In all instances, knowledge of the characteristics of the input signal 20 can be utilized to validate if the control module 14 is receiving signals as desired. The control module 14 is validated responsive to the return signal 18 meeting desired performance criteria.

Figure 3:
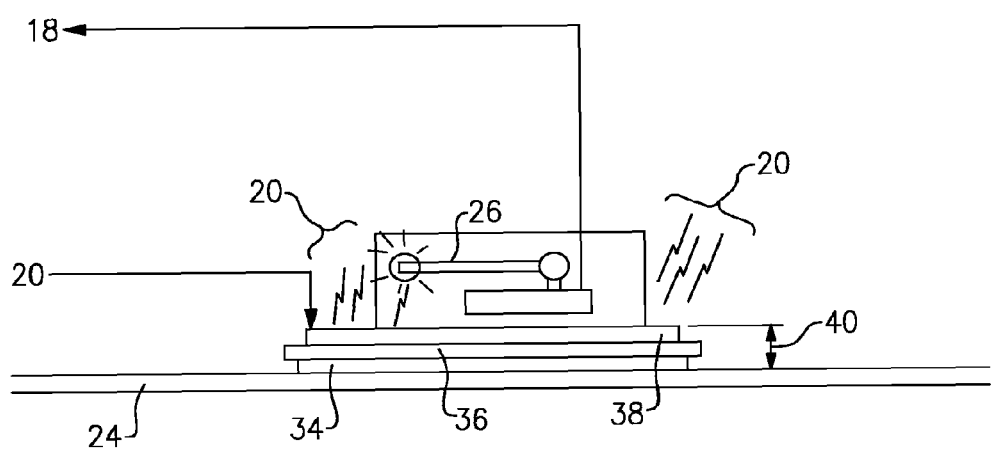
FIG. 3 is a cross-sectional view of the example control module and test device.

Referring to FIG. 3, with continued reference to FIG. 2, the position of the control module 14 within the vehicle 10 has an impact on operation and receipt of the test signal 22. The example test device 16 is configured to minimize any possible changes to the environment that cause a deviation from real world operation. In the illustrated example, the transmission line coupler device 16 is mounted between the control module 14 and the vehicle body 24 such that no perceivable change is required to the mounting orientation.

Because the example transmission line coupling device 16 is mounted between the control module 14 and the vehicle body 24, a thickness 40 is minimized. Accordingly, the example transmission line coupler 16 includes a ground contact 34 that comprises a thin sheet of conductive material that is placed in direct contact with the vehicle body 24. On top of the ground contact 34 is a dielectric layer 36 and a transmission layer 38 is disposed over at least a portion of the dielectric layer 36. Power through the transmission layer 38 is coupled to the antenna 26 to generate the return signal 18. Because the transmission line coupler 16 includes a substantially small thickness 40, the environment in which the control module 14 is located is not substantially modified, such real world application and performance of the control module 14 can be accurately modeled and verified.

Accordingly, the example method and device provides for the testing and validation of a control module having an internal antenna in substantially the same operational environment as the control module will encounter during operation. Further, the example testing and validation method does not require specialized directional equipment. Further, the example testing and validation method utilizes the antenna of the control module to further replicate actual operational conditions.

Although a preferred embodiment of this invention has been disclosed, a worker of ordinary skill in this art would recognize that certain modifications would come within the scope of this invention. For that reason, the following claims should be studied to determine the true scope and content of this invention.

The invention claimed is:

1. An electronic test system for a motor vehicle comprising:
   a control module, the control module comprising a housing; and an antenna for receiving a wireless signal supported by the housing; and
   a test device mounted to an outer surface of the housing, the test device comprising a transmission line coupler, wherein the test device generates an electromagnetic signal independent of the control module for coupling to the antenna supported within the housing.

2. The test system as recited in claim 1, wherein the test device comprises a ground conductor disposed on a first side of a dielectric and a transmission conductor disposed on a second side of the dielectric.

3. The test system as recited in claim 2, wherein the test device comprises a connector for receiving a signal input.

4. The test system as recited in claim 1, wherein the control module is mountable to a motor vehicle support structure and the test device is mountable between the control module and the motor vehicle support structure.

5. The test system as recited in claim 1, wherein the test device generates an electromagnetic signal that is coupled to the antenna of the control module.

6. The test system as recited in claim 5, wherein the test device is driven by a controller external to the motor vehicle.

7. An electronic test system for a motor vehicle comprising:
   a control module, the control module comprising a housing and an antenna for receiving a wireless signal supported by the housing; and
   a test device mounted to an outer surface of the housing, wherein the test device comprises a ground conductor disposed on a first side of a dielectric and a transmission conductor disposed on a second side of the dielectric, and wherein the test device generates an electromagnetic signal independent of the control module for coupling to the antenna supported within the housing.

8. The test system as recited in claim 7, wherein the test device comprises a connector for receiving a signal input.

9. The test system as recited in claim 7, wherein the control module is mountable to a motor vehicle support structure and the test device is mountable between the control module and the motor vehicle support structure.

10. The test system as recited in claim 7, wherein the test device generates an electromagnetic signal that is coupled to the antenna of the control module.

11. The test system as recited in claim 10, wherein the test device is driven by a controller external to the motor vehicle.

* * * * *